(12) United States Patent
Noda et al.

(10) Patent No.: US 8,986,558 B2
(45) Date of Patent: Mar. 24, 2015

(54) PLASMA ETCHING METHOD, PLASMA ETCHING DEVICE, AND METHOD FOR PRODUCING PHOTONIC CRYSTAL

(75) Inventors: Susumu Noda, Kyoto (JP); Shigeki Takahashi, Tsukuba (JP)

(73) Assignee: Japan Science and Technology Agency, Kawaguchi (JP)

( * ) Notice: Subject to any disclaimer, the term of this patent is extended or adjusted under 35 U.S.C. 154(b) by 174 days.

(21) Appl. No.: 13/061,252

(22) PCT Filed: Aug. 27, 2009

(86) PCT No.: PCT/JP2009/004178
§ 371 (c)(1),
(2), (4) Date: Feb. 28, 2011

(87) PCT Pub. No.: WO2010/023925
PCT Pub. Date: Mar. 4, 2010

(65) Prior Publication Data
US 2011/0151673 A1    Jun. 23, 2011

(30) Foreign Application Priority Data
Sep. 1, 2008   (JP) ................................. 2008-224035

(51) Int. Cl.
*H01L 21/3065* (2006.01)
*G02B 1/00* (2006.01)
*B82Y 20/00* (2011.01)

(52) U.S. Cl.
CPC ................ *G02B 1/005* (2013.01); *B82Y 20/00* (2013.01); *H01L 21/3065* (2013.01); *H01J 2237/3327* (2013.01)
USPC ................ 216/24; 216/56; 216/67; 438/710; 438/731

(58) Field of Classification Search
None
See application file for complete search history.

(56) References Cited

U.S. PATENT DOCUMENTS

| 4,590,042 A | * | 5/1986 | Drage ...................... 422/186.06 |
| 5,205,902 A | * | 4/1993 | Horton et al. .................... 216/56 |
| 5,290,382 A | * | 3/1994 | Zarowin et al. .......... 156/345.35 |
| 5,589,002 A | * | 12/1996 | Su .............................. 118/723 E |

(Continued)

FOREIGN PATENT DOCUMENTS

| JP | 1-270231 A | 10/1989 |
| JP | 11-87319 A | 3/1999 |

(Continued)

OTHER PUBLICATIONS

Notification of Reason for Rejection dated Jun. 19, 2012 for Japanese Patent Application No. 2010-526556 (with translation).

(Continued)

*Primary Examiner* — Anita Alanko
(74) *Attorney, Agent, or Firm* — Oliff PLC

(57) ABSTRACT

A plasma etching method capable of oblique etching with a high aspect ratio and high uniformity is provided. In the plasma etching method, a base body is etched with a high aspect ratio by the following process: An electric-field control device having an ion-introducing orifice penetrating therethrough in a direction inclined from the normal to the surface of a base body is placed on or above the surface of this base body. Plasma is generated on the surface of the base body on or above which the electric-field control is placed. A potential difference is formed between the plasma and the base body so as to attract ions in the plasma toward the base body.

14 Claims, 14 Drawing Sheets

(56) References Cited

U.S. PATENT DOCUMENTS

| | | | |
|---|---|---|---|
| 5,766,494 A * | 6/1998 | Mori et al. | 216/45 |
| 6,288,357 B1 * | 9/2001 | Dyer | 219/121.41 |
| 6,936,546 B2 * | 8/2005 | Robbins | 438/707 |
| 7,226,870 B2 | 6/2007 | Boufnichel et al. | |
| 8,075,790 B2 * | 12/2011 | Chang et al. | 216/67 |
| 2005/0263486 A1 * | 12/2005 | Boufnichel et al. | 216/67 |
| 2006/0243389 A1 * | 11/2006 | Hirayama et al. | 156/345.3 |
| 2007/0262052 A1 * | 11/2007 | Chang et al. | 216/67 |
| 2008/0131660 A1 * | 6/2008 | Noda et al. | 428/138 |

FOREIGN PATENT DOCUMENTS

| | | |
|---|---|---|
| JP | 2001-74955 A | 3/2001 |
| JP | 2001-272555 A | 10/2001 |
| JP | 2002-134470 A | 5/2002 |
| JP | 2007-256382 A | 10/2007 |
| JP | 2008-4711 A | 1/2008 |
| WO | WO 2006/095648 A1 | 9/2006 |

OTHER PUBLICATIONS

Yablonovitch et al., "Photonic Band Structure: The Face-Centered-Cubic Case Employing Nonspherical Atoms," The American Physical Society, Physical Review Letters, vol. 67, No. 17, Oct. 21, 1991, pp. 2295-2298.

International Preliminary Report on Patentability issued in International Patent Application No. PCT/JP2009/004178, dated Mar. 1, 2011 (w/English-language Translation).

Written Opinion of the International Searching Authority issued in International Patent Application No. PCT/JP2009/004178, dated Nov. 19, 2009 (w/English-language Translation).

International Search Report issued in International Patent Application PCT/JP2009/004178, mailed on Dec. 1, 2009 (w/English-language Translation).

Jul. 1, 2014 Supplementary European Search Report issued in European Patent Application No. 09809581.3.

Boufnichel, M. et al., "Profile control of high aspect ratio trenches of silicon. II. study of the mechanisms responsible for local bowing formation and elimination of this effect," *Journal of Vacuum Science & Technology B: Microelectronicsprocessing & Phenomena*, Jan. 1, 2003, pp. 267-273, vol. 21, No. 1, American Vacuum Society, New York, New York.

Takahashi, S. et al., "Direct creation of three-dimensional photonic crystals by a top-down approach," *Nature Materials*, Aug. 9, 2009, pp. 721-725, vol. 8, No. 9.

Aug. 29, 2014 Office Action issued in Taiwan Patent Application No. 98129190 (with translation).

\* cited by examiner

TOP VIEW

VERTICAL SECTION

TOP VIEW

VERTICAL SECTION

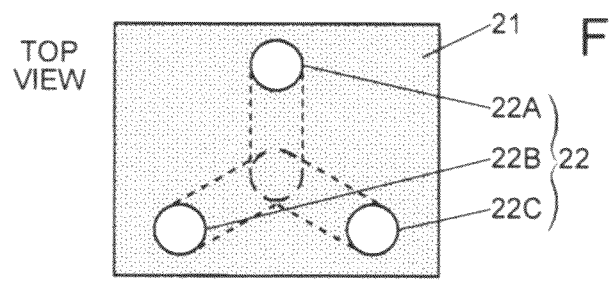
Fig. 7A
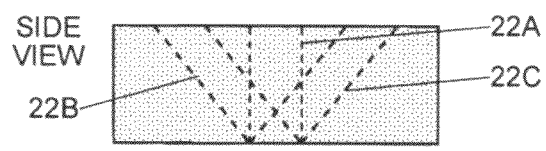
Fig. 7B
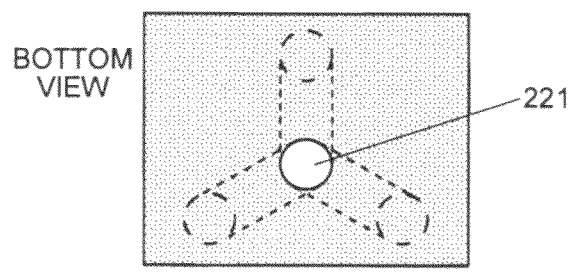
Fig. 7C
Fig. 8A
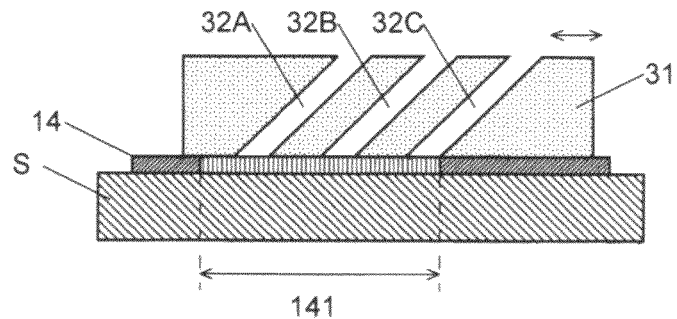
Fig. 8B
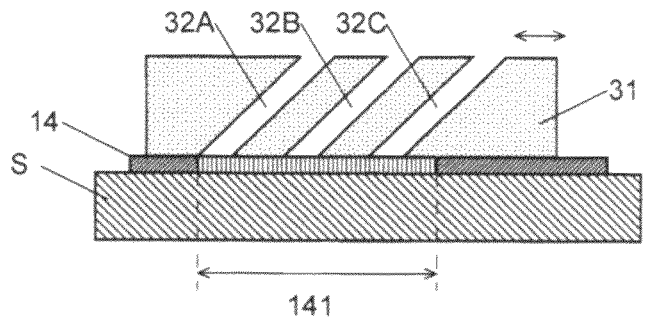

(a) DIAMETER OF ION-INTRODUCING ORIFICE (4 mm) LARGER THAN
   THICKNESS OF ION SHEATH (2.5 mm)
(a-1) EQUIPOTENTIAL
      SURFACES 15PA
(a-2) ION TRAJECTORY 16PA
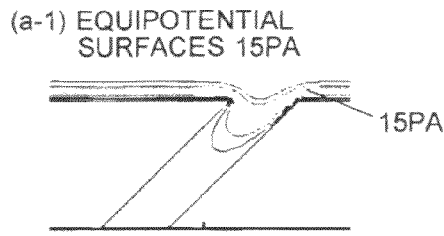
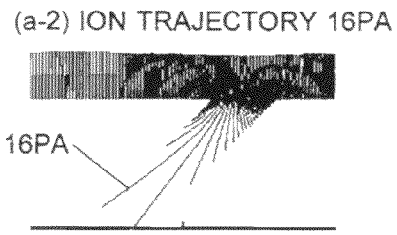
Fig. 9A                    Fig. 9B
(b) DIAMETER OF ION-INTRODUCING ORIFICE (2 mm) SMALLER THAN
   THICKNESS OF ION SHEATH (2.5 mm)
(b-1) EQUIPOTENTIAL
      SURFACES 15PB
(b-2) ION TRAJECTORY 16PB
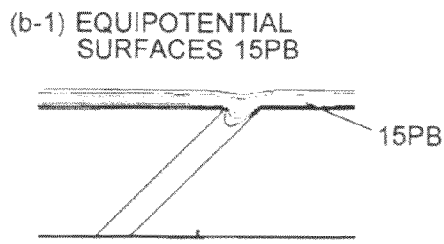
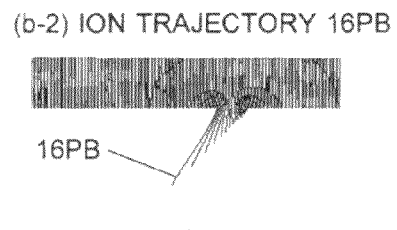
Fig. 9C                    Fig. 9D Fig. 14
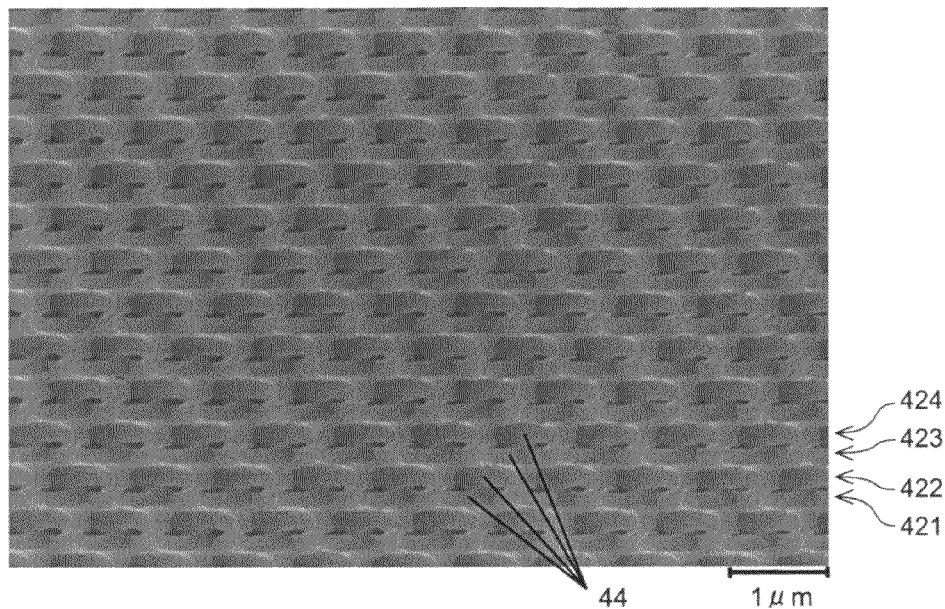
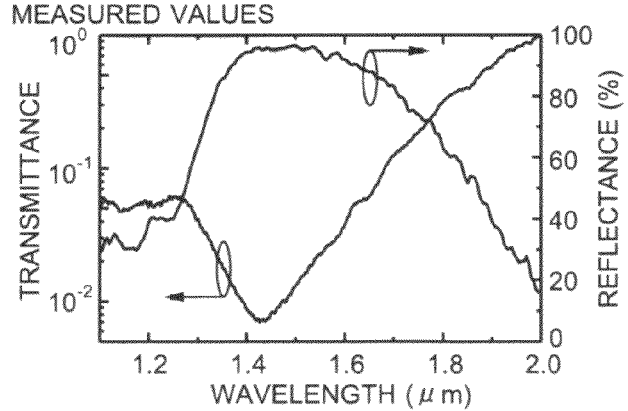
Fig. 15A
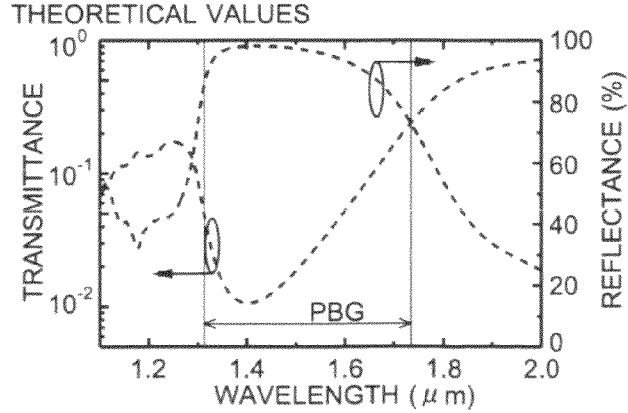
Fig. 15B

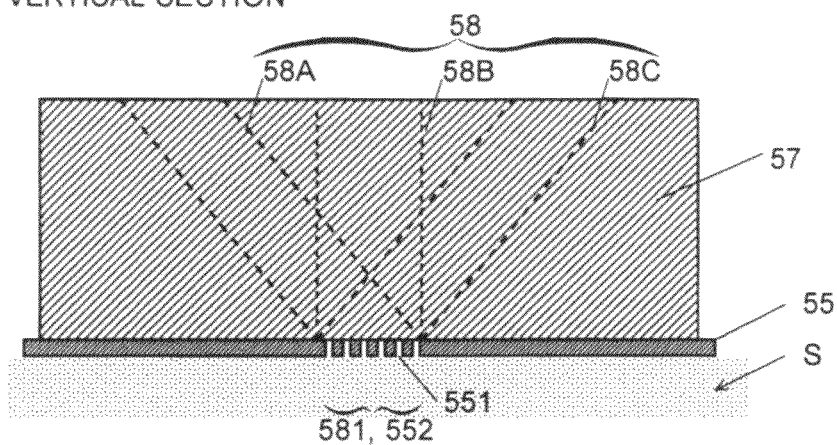
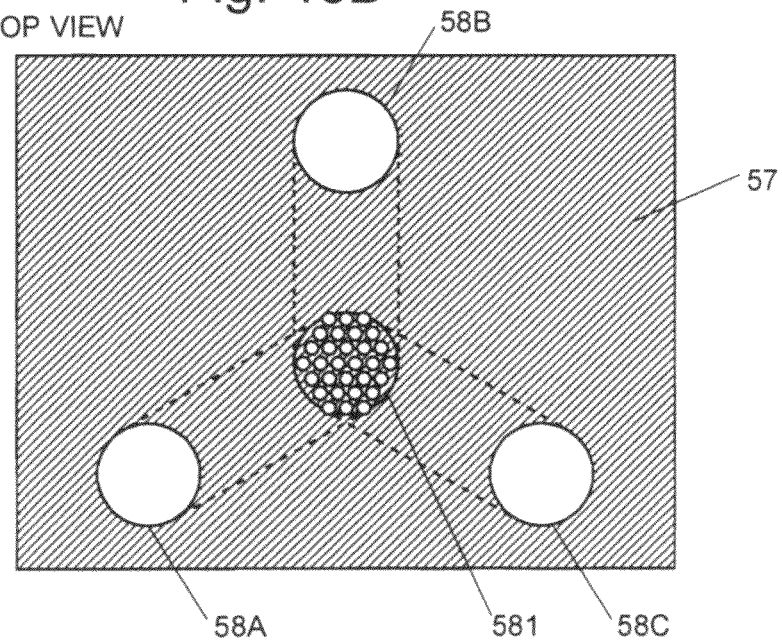

TOP VIEW

VERTICAL SECTION

TOP VIEW

VERTICAL SECTION

VERTICAL SECTION AFTER THE OPENING AREA OF
ION-INTRODUCING HOLE 73A IS CHANGED

PLASMA ETCHING METHOD, PLASMA ETCHING DEVICE, AND METHOD FOR PRODUCING PHOTONIC CRYSTAL

TECHNICAL FIELD

The present invention relates to a plasma etching method and plasma etching device suitable for the microfabrication of semiconductor devices or the like, and also to a method for producing a photonic crystal by the plasma etching method.

BACKGROUND ART

In recent years, photonic crystals have been drawing attention as a new optical device. The photonic crystal is an optical functional material with a periodic distribution of refractive index. This structure of the periodic distribution of refractive index forms a band structure for the energy of light or electromagnetic waves. This structure is particularly characterized by the formation of an energy region through which no light or electromagnetic waves can be propagated. (This region is called a "photonic band gap" or "PBG.") When a disorder (defect) is introduced in this distribution of refractive index, an energy level (defect level) due to the defect is created within the PBG, allowing only light having a wavelength corresponding to the defect level to exist at the defect. By this technique, for example, an optical resonator consisting of a point-like defect or an optical waveguide consisting of a linear defect can be created in the photonic crystal. When the photonic crystal has an optical resonator in the vicinity of an optical waveguide and the resonance wavelength of the optical resonator is within the wavelength range where light can be propagated through the optical waveguide, the photonic crystal functions as an optical multiplexer/demultiplexer that can extract light having a wavelength equal to the resonance frequency from the light propagated in the optical waveguide to the optical resonator (demultiplexing) and merge light having the same wavelength from the optical resonator into the optical waveguide (multiplexing).

Photonic crystals are broadly divided into two-dimensional photonic crystals (for example, refer to Patent Document 1) and three-dimensional photonic crystals (for example, refer to Non-Patent Document 1 and Patent Document 2). The two-dimensional photonic crystal disclosed in Patent Document 1 is a plate-shaped dielectric material in which air holes are periodically arranged. The three-dimensional photonic crystal disclosed in Non-Patent Document 1, which is called "Yablonovite", is a block-shaped dielectric material having a large number of holes formed in three directions (at 120° intervals), with each hole extending at an angle of 35° from the normal to the block surface. The three-dimensional photonic crystal disclosed in Patent Document 2, which is called a "woodpile" crystal, is a stack of stripe layers, with each layer consisting of dielectric rods arranged periodically and parallel to each other. The stripe layers are stacked so that the rods of any two nearest layers are orthogonal to each other, while the rods of any two next-nearest layers are parallel to each other and displaced by one half of the spatial period thereof. Three-dimensional photonic crystals have the advantage that it barely allows the leakage of light at the defect, thus suppressing the loss of light at the optical resonator or optical waveguide to extremely low levels.

It was conventionally said that the three-dimensional woodpile photonic crystal is difficult to produce since the stripe layers must be accurately positioned relative to each other. To address this problem, one method has been proposed in Patent Document 3. This method creates a three-dimensional photonic crystal by a two-stage etching process; the first etching is performed in a first direction inclined to the surface of a dielectric base body to create a hole extending in the first direction, after which the second etching is performed in a second direction intersecting with the first direction at a predetermined angle to create another hole that extends in the second direction. In this method, the $4n^{th}$ stripe layer and the next-nearest $4n+2^{nd}$ stripe layer are created by the first etching (where n is an integer), and the $4n+1^{st}$ stripe layer and the next-nearest $4n+3^{rd}$ stripe layer are created by the second etching. This method facilitates the production of the device since it requires no positioning of the stripe layers.

On the other hand, the two-dimensional photonic crystal has the advantage that it is easier to produce than the three-dimensional photonic crystal. In recent years, a two-dimensional photonic crystal that is capable of creating a PBG effective for both TE-polarized and TM-polarized waves (complete PBG) over a wider energy range than in the conventional crystals has been proposed. Patent Document 4 discloses a two-dimensional photonic crystal having a plate-shaped base body with three elongated air holes extending in different directions from each lattice point of a triangular lattice (three-directional oblique holes). The three air holes are formed at angular intervals of 120° when projected on a plane parallel to the surface of the base body, and each air hole is inclined at approximately 36° from the normal to the base body. For a base body made of silicon, this two-dimensional photonic crystal can have a complete PBG with a large width of approximately 15% (which is defined as the ratio of the width of the complete PBG to the energy value at the center of the complete PBG (gap-midgap ratio)). This value is much larger than that of the complete PBG created in conventional photonic crystals, which is no greater than several percents.

Both the three-dimensional photonic crystal described in Patent Document 3 and the two-dimensional photonic crystal having the three-directional oblique holes described in Patent Document 4 can be produced by etching a base body in a direction inclined to the base body by a predetermined angle (oblique etching). The oblique etching can be used not only for the production of photonic crystals but also for the microfabrication of semiconductor devices, the production of microelectromechanical systems (MEMS), and other processes.

Patent Document 5 discloses an etching method in which an electric-field control plate having an edge obliquely formed with respect to the surface of the base body is placed on the surface of the base body, and a bias voltage is applied to the ions in the plasma to make the ions impinge on the surface of the base body. In this method, the equipotential surfaces are deformed along the oblique edge and the ions impinge on the surface of the base body in an oblique direction appropriately perpendicular to the equipotential surfaces, thus achieving the oblique etching.

PRIOR ART DOCUMENTS

Patent Documents

Patent Document 1: Japanese Unexamined Patent Application Publication No. 2001-272555
Patent Document 2: Japanese Unexamined Patent Application Publication No. 2001-074955
Patent Document 3: Pamphlet of International Publication No. WO2006/095648
Patent Document 4: Japanese Unexamined Patent Application Publication No. 2007-256382

Patent Document 5: Japanese Unexamined Patent Application Publication No. 2008-004711

Non-Patent Documents

Non-Patent Document 1: E. Yablonovitch et al.: "Photonic band structure: The face-centered-cubic case employing nonspherical atoms", *Physical Review Letters* 67 (1991) 2295-2298.

DISCLOSURE OF THE INVENTION

Problem to be Solved by the Invention

To fabricate a photonic crystal or similar device with high precision by the oblique etching, it is necessary to achieve a high level of uniformity in the incident angle of the ions to the surface of the base body. If this uniformity is low, it is impossible to create a hole having a uniform diameter in the longitudinal direction. The non-uniformity in the diameter of the hole becomes more recognizable as the hole to be formed becomes deeper or its diameter becomes smaller, i.e. as the aspect ratio of the hole (the depth-to-diameter ratio of the hole) becomes higher.

Thus, the problem to be solved by the present invention is to provide a plasma etching method capable of performing oblique etching with a high aspect ratio and high uniformity, and a method for producing a photonic crystal by this plasma etching method.

Means for Solving the Problems

The plasma etching method according to the present invention aimed at solving the previously described problem is characterized in that a base body is etched with a high aspect ratio by a process including:

placing an electric-field control device on a surface of a base body, the electric-field control device having an ion-introducing orifice penetrating therethrough in a direction inclined from the normal to the surface of the base body;

generating plasma on the surface of the base body on or above which the electric-field control device is placed; and forming a potential difference between the plasma and the base body so as to attract ions in the plasma toward the base body.

In the plasma etching method according to the present invention, the aforementioned potential difference causes the ions in the plasma to impinge on the surface of the base body through the ion-introducing orifice, thereby etching the base body by physical sputtering or reactive sputtering using the kinetic energy of the ions. In this process, the equipotential surfaces are drawn from the plasma-side mouth of the ion-introducing orifice into this orifice, being shaped approximately perpendicular to the extending direction of the ion-introducing orifice. As a result, the ions experience a force parallel to the ion-introducing orifice, to be introduced into the same orifice.

Among the ions introduced into the ion-introducing orifice, the ions injected at angles greater than a specific angle from the direction of inclination of the ion-introducing orifice inelastically collide with the inner wall of the ion-introducing orifice and lose their kinetic energy. Such ions barely contribute to the etching. Therefore, only the ions injected at angles close to the direction of inclination of the ion-introducing orifice can impinge on the surface of the base body. Thus, the dispersion of the incident angle of the ions to the surface of the base body is reduced, so that the base body can be etched in the incident direction of the ions with a high aspect ratio. As the mouth of the ion-introducing orifice becomes smaller, or as the ion-introducing orifice becomes longer, the ions whose incident direction is considerably deviated from the direction of inclination of the ion-introducing orifice become more likely to collide with the inner wall of the ion-introducing orifice, which improves the accuracy of the incident angle of the ions impinging on the surface of the base body.

When a mask having a large number of holes arranged in a predetermined pattern is placed at the mouth of the ion-introducing orifice facing the base body, the base body will be etched in a form corresponding to that pattern.

The production of photonic crystals or microfabrication of semiconductor devices normally uses a mask having one or more holes with a diameter of a few micrometers or smaller (on the order of micrometers or lower). These holes in the mask do not work like the ion-introducing orifice of the electric-field control device even if those holes are formed in a direction inclined from the normal to the surface of the base body. The reason is as follows. When plasma is created with a normal type of plasma generation device, the plasma forms an ion sheath near the surface of the base body. The ion sheath has a thickness of approximately 10 µm to 10 mm, depending on the plasma density or self-bias voltage. This thickness is greater than the diameter of the hole of the mask. When the thickness of the ion sheath is greater than the diameter of the hole of the mask, the equipotential surfaces are barely pulled into the hole of the mask. In this situation, the electric field hardly affects the ions in the direction parallel to the hole (in the direction inclined from the normal to the surface of the base body), allowing the ions to considerably deviate from the direction of inclination of the hole. Therefore, it is necessary to use, apart from the hole of the mask, an electric-field control device having an ion-introducing orifice whose diameter is larger than that of the hole of the mask (e.g. on the order of millimeters).

The electric-field control device may be directly placed on the surface of the base body or the mask. It is also possible to hold it above the surface of the base body or the mask, with a gap in between, by using, for example, a support overhanging the base body from one side thereof.

The ion-introducing orifice may have a larger cross section at the surface of the electric-field control device and a smaller cross section inside the electric-field control device. The larger cross section at the surface causes the equipotential surfaces to be drawn deeper into the ion-introducing orifice. The reduced cross section inside has the effect of causing the ions having a less deviated incident direction to collide with the inner wall of the ion-introducing orifice, thus improving the precision of the incident angle.

The ion-introducing orifice may have a plurality of holes extending in different directions from one mouth provided on the side facing the base body. This design enables the oblique etching to be simultaneously performed in two or more directions.

In the plasma etching method according to the present invention, the electric-field control device may be moved along the surface of the base body while the aforementioned potential difference is formed. This technique enables the oblique etching to be performed over an area larger than the diameter of the ion-introducing orifice while maintaining the characteristic that the etching is performed with a high aspect ratio. Even a large area can be efficiently etched by forming a plurality of ion-introducing orifices in the electric-field control device. The electric-field control device may be moved without changing its orientation or with its orientation being changed concurrently. It may also be turned (rotated) without changing its location. The expression "the electric-field control device is moved along the surface of the base body" means any operations for changing the relative position between the electric-field control device and the surface of the base body, such as moving the electric-field control device along the surface of a fixed base body, moving the base body relative to the electric-field control device held in a stationary position, or moving both the electric-field control device and the base body.

In the plasma etching method according to the present invention, the direction of inclination in the electric-field control device may be designed to be variable. An electric-field control device having a variable direction of inclination can be created, for example, by arranging two or more louver plates rotatable in the same direction, with their axes of rotation extending parallel to each other. In this case, the space between the neighboring louver plates corresponds to the ion-introducing orifice. The direction of inclination of the ion-introducing orifice may be changed for each base body to be etched, or the direction may be changed while one base body is being etched. By changing the direction of inclination while etching one base body, an intentionally curved hole can be formed in the base body.

In the plasma etching method according to the present invention, the area of the mouth of the ion-introducing orifice in the electric-field control device may be designed to be variable. For example, similar to the previous case of the ion-introducing orifice having a variable direction of inclination, an arrangement of two or more louver plates can be used as an electric-field control device having a variable area of the mouth. In this case, the mouth are of the ion-introducing orifice can be made to be variable by designing the louver plates so that they can be individually moved in their arrangement direction.

The plasma etching device according to the present invention is for etching a base body with a high aspect ratio and is characterized by including:
an electric-field control device to be placed on or above the base body, the electric-field control device having an ion-introducing orifice penetrating therethrough in a direction inclined from the normal to the surface of the base body;
a plasma generation means for generating plasma on the surface of the base body on or above which the electric-field control device is placed; and
an electric potential formation means for forming a potential difference between the plasma and the base body so as to attract ions in the plasma toward the base body.

The method for producing a photonic crystal according to the present invention uses the previously described plasma etching method and is characterized in that a dielectric base body is etched in a predetermined pattern and with a high aspect ratio by a process including the following steps:
a mask having a large number of holes in a predetermined pattern is set at a hole creation area which is a portion of the surface of the base body;
an electric-field control device having an ion-introducing orifice penetrating therethrough in a direction inclined from the normal to the surface of the base body is placed so that the mouth of the ion-introducing orifice facing the base body is adjusted at the position of the hole creation area;
plasma is generated on the surface of the base body on or above which the electric-field control device is placed; and
a potential difference is formed between the plasma and the base body so as to attract ions in the plasma toward the base body.

In the previously described method for producing a photonic crystal, it is preferable to perform the etching process multiple times, while changing the orientation of the electric-field control device each time. For example, in the case of producing a three-dimensional Yablonovite photonic crystal described in Non-Patent Document 1 or the two-dimensional photonic crystal with three-directional oblique holes described in Patent Document 4, the previously described etching process is performed three times, with the orientation of the electric-field control device changed by 120° each time.

The three-dimensional "woodpile" photonic crystal described in Patent Document 2 can be produced in the following manner, in which the previously described etching is performed in two stages, with the orientation of the electric-field control device changed each time.

a) In the First Etching Stage:
  a-1) a mask with holes formed for a plurality of belt-like areas is used, where the holes formed for a $4n^{th}$ belt-like area (where n is an integer) are arranged with spatial period $a_1$ and the holes formed for a $4n+2^{nd}$ belt-like area are arranged with spatial period $a_1$ and displaced by $a_1/2$ in the longitudinal direction of the belt-like areas;
  a-2) the electric-field control device is arranged so that the ion-introducing orifice becomes inclined at a first angle from a normal to the surface of the base body in the extending direction of the belt-like areas;

b) In the Second Etching Stage:
  b-1) a mask with holes is used, where the holes formed for a $4n+1^{st}$ belt-like area are arranged with spatial period $a_1$ and the holes formed for a $4n+3^{rd}$ belt-like area are arranged with spatial period $a_1$ and displaced by $a_1/2$ in the longitudinal direction of the belt-like areas; and
  b-2) the electric-field control device is arranged so that the ion-introducing orifice becomes inclined at a second angle, which is different from the first angle, from a normal to the surface of the base body in the extending direction of the belt-like areas.

In the previously described method for producing a photonic crystal, the oblique etching can be simultaneously performed in three directions by using an electric-field control device with the ion-introducing orifice having a plurality of holes extending from one mouth provided on the side facing the base body. Therefore, air holes for the three-dimensional Yablonovite photonic crystal or two-dimensional photonic crystal with three-directional oblique holes can be simultaneously created by one-stage etching.

Effect of the Invention

By the plasma etching method according to the present invention, oblique etching with a high aspect ratio and high uniformity can be performed. By applying this plasma etching method to the production of a photonic crystal, it is possible to obtain a photonic crystal which is less disordered in its periodicity and has high properties that are closer to the theoretically expected levels.

BRIEF DESCRIPTION OF THE DRAWINGS

FIGS. 7A-7C are a top view, bottom view and side view, respectively, of an electric-field control device 21 having a plurality of ion-introducing orifices extending in different directions from one mouth facing the base body S.

FIGS. 8A and 8B are schematic diagrams showing an example of etching an area larger than the mouth of the ion-introducing orifice.

FIGS. 9A-9D are vertical sectional views showing the results of calculations of the ions' trajectory in comparative examples.

FIG. 14 is an electron microscope image showing a top face of a three-dimensional "woodpile" photonic crystal fabricated by a method according to the present invention.

FIGS. 15A and 15B are graphs showing measured values and theoretical values, respectively, of the reflectance and transmittance of a three-dimensional "woodpile" photonic crystal fabricated by a method according to the present invention.

FIGS. 18A and 18B are a vertical sectional view and a top view, respectively, showing a second method for producing a two-dimensional photonic crystal having three-directional oblique holes.

BEST MODE FOR CARRYING OUT THE INVENTION (1) Embodiment of Plasma Etching Method According to Present Invention One embodiment of the plasma etching method according to the present invention is hereinafter described by means of FIGS. 1-9D. FIG. 1 is a vertical sectional view showing one example of the shape and position of an electric-field control device 11 in a process of performing oblique etching on a base body S by the plasma etching method according to the present invention. The electric-field control device 11 is set on the base body S via a mask 14. An ion-introducing orifice 12 penetrates through the electric-field control device 11 at angle θ from the normal to the surface of the base body S. One surface (top face) 13 of the electric-field control device 11 is perpendicular to the ion-introducing orifice 12 at the position of the upper mouth of the ion-introducing orifice 12. The mask 14 has a large number of holes (not shown) located immediately below the lower mouth of the ion-introducing orifice 12. These holes correspond to the shape into which the base body S should be etched.

Figure 1:
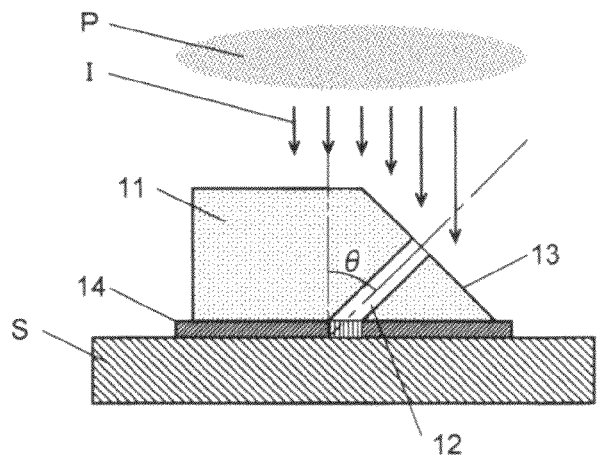
FIG. 1 is a vertical sectional view showing one example of the shape and position of an electric-field control device 11 in one embodiment of the plasma etching method according to the present invention.
Figure 2:
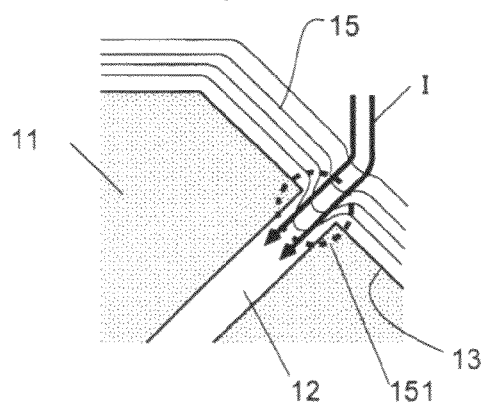
FIG. 2 is a schematic diagram showing the equipotential surfaces 15 formed near the surface of the electric-field control device 11.

With the electric-field control device 11 thus set, plasma P is generated by the same method as the conventional reactive ion etching method, and a bias voltage is applied to the ions I in the plasma P to accelerate these ions and make them impinge on the surface of the electric-field control device 11. By this bias voltage application, equipotential surfaces 15 parallel to the surface of the electric-field control device 11 are created near this surface. The portion 151 of these equipotential surfaces 15 near the mouth of the ion-introducing orifice 12 is deformed to be pulled into the ion-introducing orifice 12 (FIG. 2). Ions I that have reached the vicinity of this mouth will be drawn into the ion-introducing orifice 12, experiencing a force perpendicular to the deformed equipotential surfaces 151. Any ion that has entered the ion-introducing orifice 12 in a direction deviated from the longitudinal direction of the ion-introducing orifice 12 inelastically collides with the inner wall of the ion-introducing orifice 12 and loses its kinetic energy. Such an ion barely contributes to the etching even if it reaches the surface of the base body. Therefore, the dispersion of the incident angle of the ions impinging on the surface of the base body S is so small that the base body S can be etched with a high aspect ratio. The ion-introducing orifice 12 may have a corrugated pattern on its inner wall, whereby the ions colliding with the inner wall of the ion-introducing orifice 12 will be more assuredly prevented from reaching the surface of the base body S.

In the electric field control body 11 of the present embodiment, in addition to the direction of the ion-introducing orifice 12, the design that the surface 13 of the electric field is perpendicular to the ion-introducing orifice 12 (and is also inclined to the surface of the base body S) further facilitates the entry of the ions I in the longitudinal direction of the ion-introducing orifice 12.

Figure 3A:
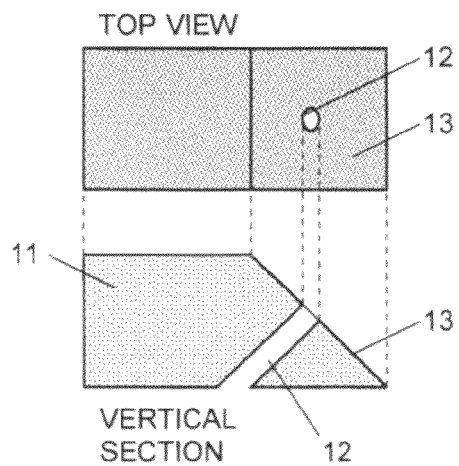
FIGS. 3A and 3B are top views and vertical sectional views, respectively, of the electric-field control device 11.
Figure 3B:
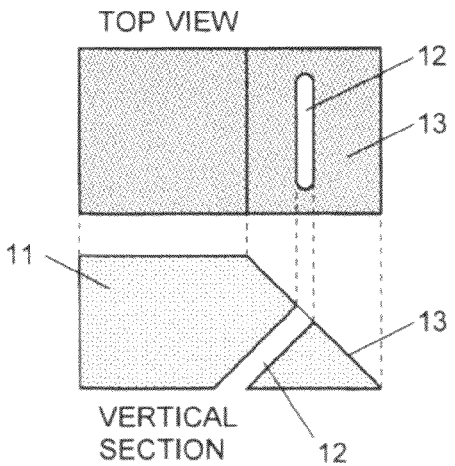

FIGS. 3A and 3B show top views as well as vertical sectional views of the electric-field control device 11. The ion-introducing orifice 12 shown in FIG. 3A has a circular cross section at the surface 13 of the electric-field control device 11 while the ion-introducing orifice 12 shown in FIG. 3B has a groove-like cross section at the surface 13 of the electric-field control device 11.

Figure 4A:
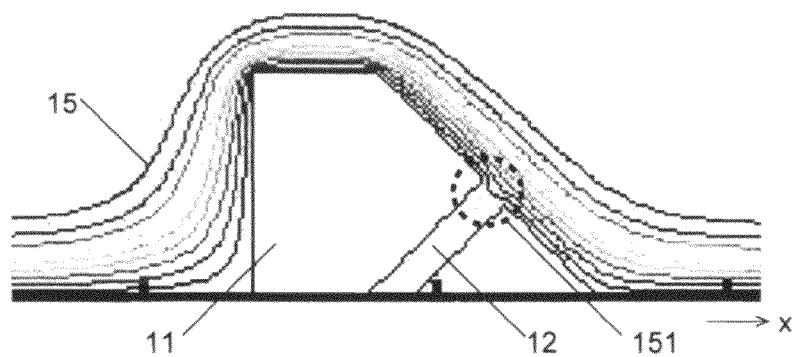
FIGS. 4A and 4B are vertical sectional views showing the results of calculations of the equipotential surfaces formed near the surface of the electric-field control device 11 and the ions' trajectory, respectively.
Figure 4B:
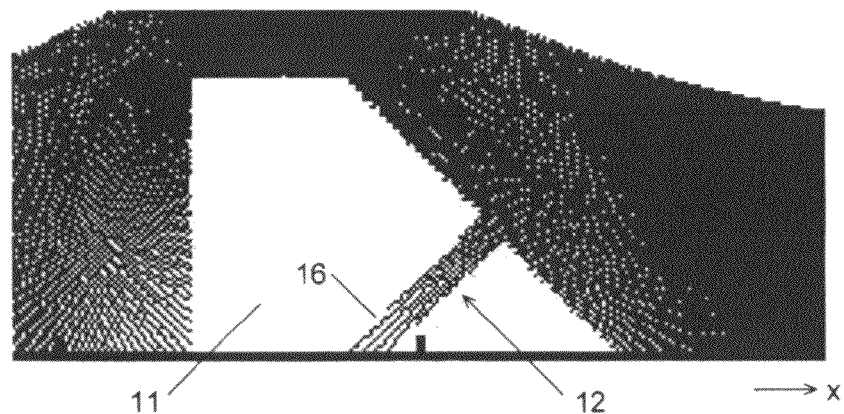
Figure 4C:
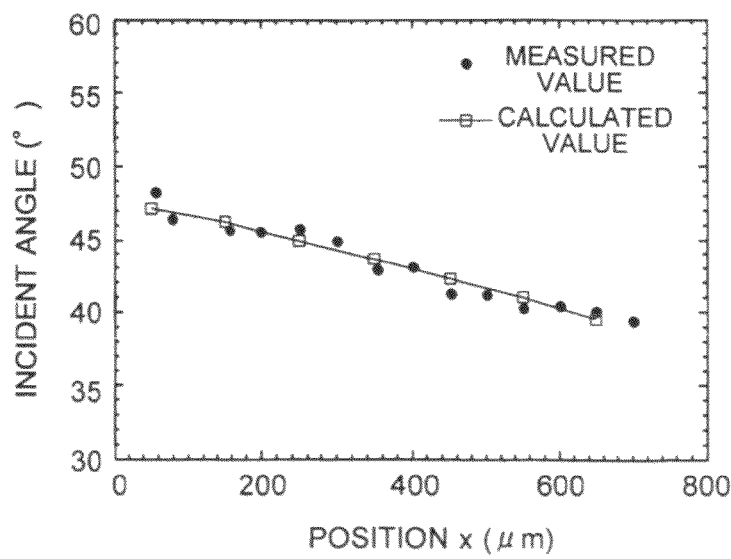
FIG. 4C is a graph showing calculated and measured values of the incident angle of the ions to the surface of the base body.

For an oblique etching process using the electric-field control device 11 of the present embodiment, FIGS. 4A and 4B show the results of calculations of the equipotential surfaces formed near the surface of the electric-field control device 11 and the ions' trajectory, respectively, while FIG. 4C shows calculated and measured values of the incident angle of the ions to the surface of the base body. The electric-field control device 11 used in the experiment was made of aluminum. The ion-introducing orifice 12 was 0.5 mm in diameter and 2.6 mm in length, with an inclination angle of 45° from the normal to the surface of the base body. $SF_6$ gas and $O_2$ gas were used for plasma generation. In accordance with the experimental conditions, the calculations were conducted for the trajectory of $SF^{2+}$ ion under the conditions that the self bias voltage was −130 V, the plasma density was $4.5×10^{16}$ $m^{-3}$, the electron temperature (energy) was 6 eV.

As shown in FIG. 4A, the equipotential surfaces 151 near the mouth of the ion-introducing orifice 12 are deformed to be pulled into the ion-introducing orifice 12. As shown in FIG. 4B, the trajectories 16 of the ions inside the ion-introducing orifice 12 are approximate to the longitudinal direction of the ion-introducing orifice 12, which is at an angle of 45° from the normal to the surface of the base body S. FIG. 4C shows the results of an experiment and calculation conducted for demonstrating that the incident angle of the ion depends on its incident position within the mouth of the ion-introducing orifice 12 facing the base body. The measured values agree well with the calculated values within an acceptable error range. The incident angle was within a range from 40° to 47° over the entire range covered by the experiment and calculation.

Figure 5A:
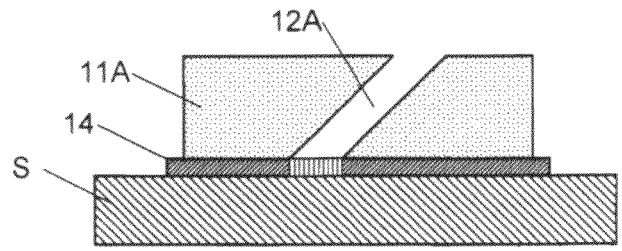
FIGS. 5A and 5B are vertical sectional views of an electric-field control device 11A, which is another example of the electric-field control device.
Figure 5B:
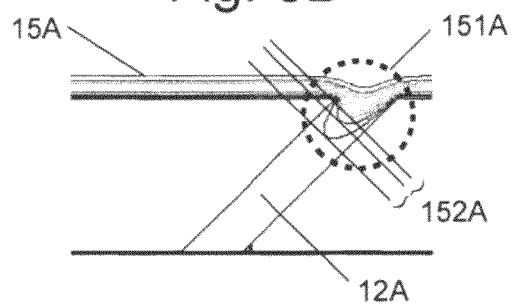

FIGS. 5A and 5B show another example of the electric-field control device. The electric-field control device 11A shown in FIG. 5A has a top face parallel to the base body S. The ion-introducing orifice 12A is inclined with respect to both the top face of the electric-field control device and the base body S. FIG. 5B shows the result of a calculation of the equipotential surfaces formed near the top face of the electric-field control device when the electric-field control device 11A is used. The portion 151A of the equipotential surfaces 15A near the mouth of the ion-introducing orifice 12A at the top face is pulled into the ion-introducing orifice 12A. The tangents 152A to the bottoms of the equipotential surfaces 151A are all approximately perpendicular to the ion-introducing orifice 12A. Therefore, the ions will be drawn into the ion-introducing orifice 12A at angles approximately parallel to the ion-introducing orifice 12A.

Figure 6A:
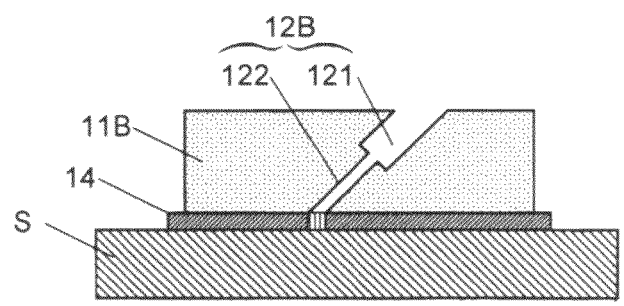
FIGS. 6A and 6B are vertical sectional views of an electric-field control device 11B, which is still another example of the electric-field control device.
Figure 6B:
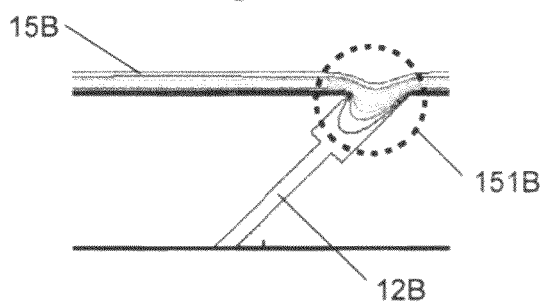

FIGS. 6A and 6B show an example of the electric-field control device in which the diameter of the ion-introducing orifice changes. Similar to the previous electric-field control device 11A, the electric-field control device 11B shown in these figures has a top face parallel to the base body S, with the ion-introducing orifice 12B being inclined with respect to both the top face of the electric-field control device and the base body S. Additionally, the diameter of the ion-introducing orifice on the base body side of the electric-field control device is smaller than that on the top-face side. By using the ion-introducing orifice 12B having such a form, the equipotential surfaces 151B at the mouth of the electric-field control device on the top side 121 can be pulled deep into the ion-introducing orifice 12B (FIG. 6B). This design is also effective for improving the precision of the incident angle since it widens the range of the incident angle where the ions collide with the inner wall of the ion-introducing orifice on the base body side 122.

In the examples described thus far, the top face of the electric-field control device was perpendicular to the ion-introducing orifice (FIGS. 4A-4C) or parallel to the surface of the base body S (FIGS. 5A, 5B, 6A and 6B). The orientation of the top face of the electric-field control device is not limited to these examples and may be appropriately selected.

FIGS. 7A-7C show a top view, bottom view and side view, respectively, of an electric-field control device 21 having a plurality of ion-introducing orifices extending in different directions from one mouth facing the base body S. The ion-introducing orifice 22 has one mouth 221 at the bottom face of the electric-field control device 21, which faces the base body (not shown), with three holes (first, second and third holes 22A, 22B and 22C) extending toward the top face of the electric-field control device 21 from the mouth 211 facing the base body. The first, second and third holes 22A, 22B and 22C are each inclined at the same angle from the normal to the surface of the base body and the face of the electric-field control device 21 facing the base body. When such an ion-introducing orifice 22 is used, ions will pass through the first, second and third holes 22A, 22B and 22C and impinge on the surface of the base body in mutually different directions, whereby the oblique etching is simultaneously performed in those three directions.

The ion-introducing orifice shown in FIGS. 7A-7C has three holes extending from one mouth. Alternatively, it may have two extending holes, or four or more extending holes. Furthermore, as opposed to the example shown in FIGS. 7A-7C in which the three holes are each inclined at the same angle from the normal to the face of the electric-field control device 21 facing the base body, the three (or two, four or more) holes may be inclined at different angles.

FIGS. 8A and 8B show an example in which the etching is performed while the electric-field control device is moved so as to etch an area larger than the mouth of the ion-introducing orifice. As shown in FIG. 8A, the electric-field control device 31 has a plurality of ion-introducing orifices 32A, 32B, 32C and so on, with the mask 14 placed between the electric-field control device 31 and the base body S. In this mask 14, a pattern of holes is formed over an area (pattern formation area 141) that is larger than the mouth of the ion-introducing orifice on the side facing the base body S. During an etching process, after the plasma is generated, with a potential difference created so as to attract the ions in the plasma toward the base body S, the electric-field control device 31 is moved one or more times so that the portion where the mouth of the ion-introducing orifice on the side facing the base body S passes through the entirety of the pattern formation area 141. Thus, the oblique etching can be performed over the entire pattern formation area 141.

The operation described in the example of FIGS. 8A and 8B in which a plurality of ion-introducing orifices are provided, can be similarly performed even if there is only one ion-introducing orifice. To prevent the base body or the mask from being in contact with the electric-field control device and thereby damaged, it is possible, for example, to hold the electric-field control device above the mask (aloft) by using a support overhanging the base body from one side thereof, leaving a gap between the electric-field control device and the base body or the mask.

FIGS. 9A-9D show the result a calculation of a relationship between the thickness of the ion sheath and the diameter of the ion-introducing orifice. The calculation assumed that the electric-field control device had a top face parallel to the surface of the base body S and the ion-introducing orifice had a groove-like cross section at the top face. The plasma parameters were set so that the thickness of the ion sheath would be 2.5 mm. A comparison was made between case (a) where the diameter (groove width) of the ion-introducing orifice was 4 mm, which was larger than the ion-sheath thickness, and case (b) where the diameter was 2 mm, which was smaller than the ion-sheath thickness. In case (a), the equipotential surfaces 15PA (FIG. 9A) are considerably pulled into the ion-introducing orifice, so that the ions sufficiently experience the force due to the electric field parallel to the orifice (and inclined from the normal to the surface of the base body). As a result, the ions' trajectory 16 (FIG. 9B) is bent toward the direction of inclination of the orifice. By contrast, in case (b), the equipotential surfaces 15PB (FIG. 9C) are barely pulled into the ion-introducing orifice, and the ions do not sufficiently experience the force parallel to the orifice. Therefore, the ions' trajectory 16PB (FIG. 9D) is not fully bent, causing the ions to collide with the inner wall of the ion-introducing orifice.

Normally, the thickness of the ion sheath in plasma etching is approximately within a range from 10 µm to 10 mm and, in most cases, the diameter of the holes in the mask is smaller than the thickness of the ion sheath. Accordingly, even if the holes of the mask are designed to be inclined from the normal to the surface of the base body in an attempt to make the mask function as the electric-field control device, the ions' trajectory will not be sufficiently bent. Therefore, apart from the holes of the mask, an electric-field control device with an ion-introducing orifice having an appropriate diameter must be used.

(2) Embodiments of Photonic Crystal Production Method According to the Present Invention Embodiments of the method for producing a photonic crystal by the plasma etching method according to the present invention are hereinafter described by means of FIGS. 10A-19.

(2-1) Three-Dimensional Woodpile Photonic Crystal

Figure 10A:
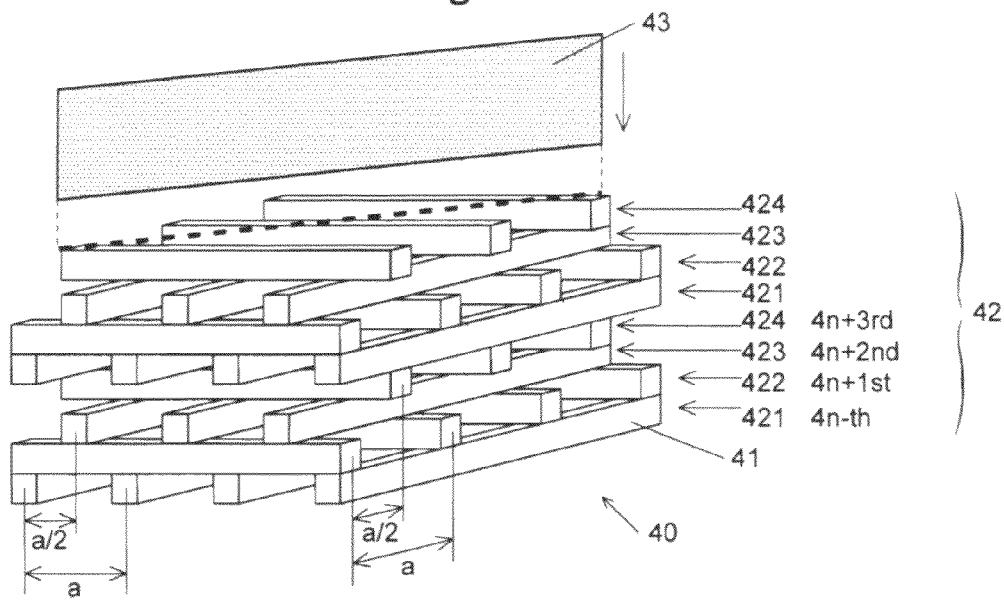
FIG. 10A is a perspective view of a three-dimensional "woodpile" photonic crystal.

FIG. 10A shows a perspective view of a three-dimensional woodpile photonic crystal 40 which is one example of the photonic crystal that can be fabricated by the method according to the present invention. The three-dimensional woodpile photonic crystal 40 consists of a stack of stripe layers 42, with each stripe layer 42 having a plurality of rods 41 made of a dielectric material, such as Si or GaAs, and arranged with spatial period a. The stripe layers 42 are stacked so that the same structure appears for every four layers. The rods 41 of the $4n^{th}$ stripe layer 421 and those of the $4n+2^{nd}$ stripe layer 423 (where n is an integer in the present and following descriptions) are substantially parallel to each other and displaced from each other by one half of the spatial period. Such a relationship also applies to the rods 41 of the $4n+1^{st}$ stripe layer 422 and those of the $4n+3^{rd}$ stripe layer 424. Any two nearest stripe layers 42 have their rods 41 oriented substantially perpendicular to each other. Even if the intersecting angle is slightly different from 90°, a photonic band gap can be created within the stacked layers, thus enabling the structure to function as a photonic crystal.

Figure 10B:
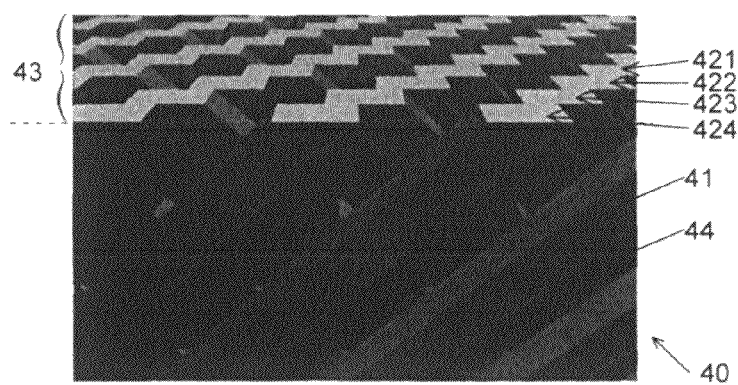
FIG. 10B is a sectional view thereof at plane 43.

FIG. 10B shows another perspective view seen in a direction different from FIG. 10A. In FIG. 10B, a section 43 perpendicular to the stripe layers 42 and intersecting with the rods 41 at an angle of 45° is shown as the top surface. In the stripe layers 421 and 423, the rods 41 are obliquely formed from the top left to bottom right of the drawing, and the air gaps 44 between the rods 41 also extend from top left to bottom right. In the other stripe layers 422 and 424, both the rods 41 and the air gaps 44 are obliquely formed from the top right to bottom left of the drawing.

Figure 11A:
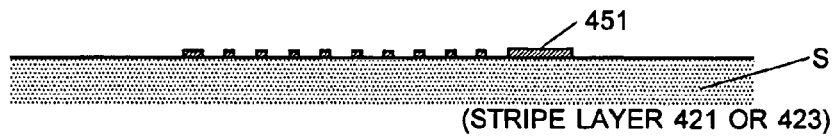
FIGS. 11A-11E are vertical sectional views showing the process of fabricating a three-dimensional "woodpile" photonic crystal by a method according to the present invention.
Figure 11B:
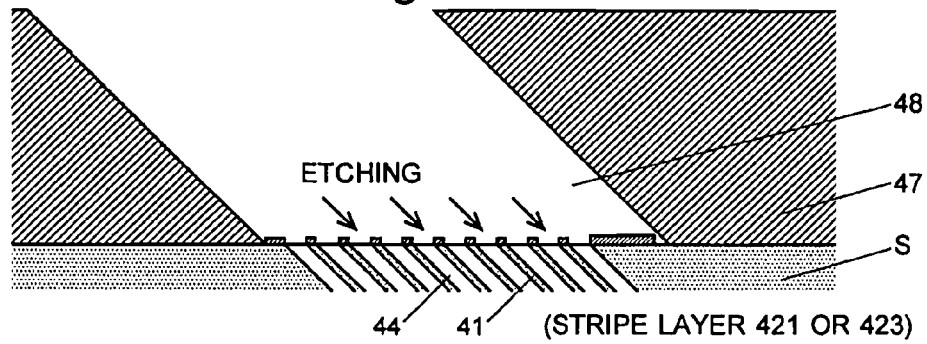
Figure 11C:
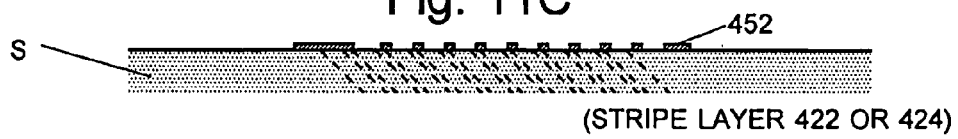
Figure 11D:
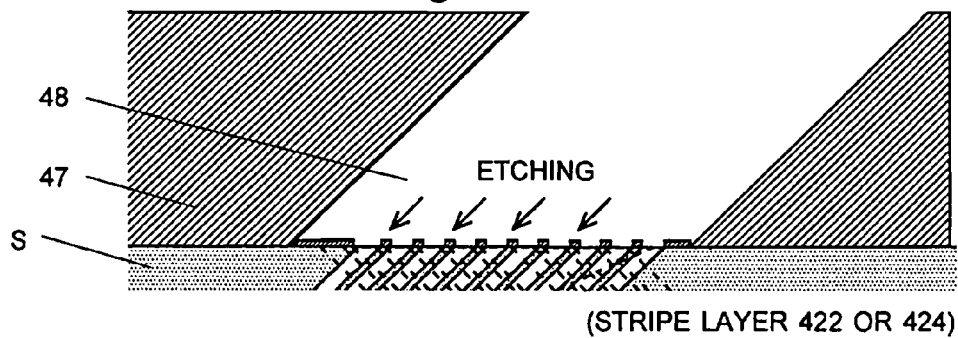
Figure 11E:
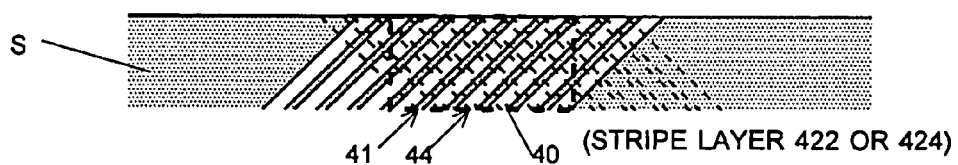

In the photonic crystal production method of the present embodiment, the three-dimensional photonic crystal 40 is produced by creating the oblique air gaps 44 from the section 43 by the plasma etching method of the present invention. This method is hereinafter described by means of FIGS. 11A-11E and FIGS. 12A and 12B. The cross section shown in FIGS. 11A-11E is a plane parallel to the stripe layers 42 of the three-dimensional photonic crystal 40 to be produced by the present method. Specifically, the cross section shown in FIGS. 11A and 11B is a plane passing through the stripe layer 421 or 423, and the cross section shown in FIGS. 11C-11E is a plane passing through the stripe layer 422 or 424.

Figure 12A:
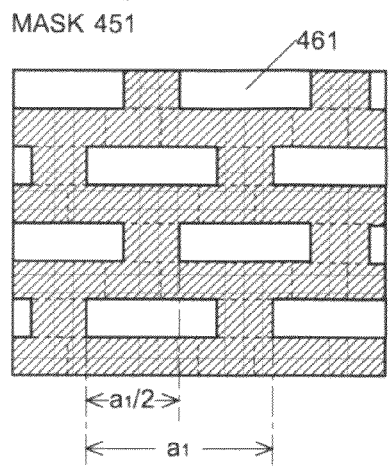
FIGS. 12A and 12B are top views of the masks used for fabricating a three-dimensional "woodpile" photonic crystal by a method according to the present invention.

To begin with, a base body S made of the same material as that of the rod 41 is prepared, and a first mask 451 is formed on the surface of the base body S (FIG. 11A). As shown in FIG. 12A, the first mask 451 has holes 461 formed at the positions that correspond, at the cross section 43, to the air gaps 44 of the stripe layers 421 and 423. The holes 461 are arranged with spatial period $a_1$ in a direction parallel to the stripe layers. (For example, $a_1 = 2^{0.5}a$ if the etching angle is 45° to the surface of the base body S.) The holes in the belt-like area corresponding to the stripe layer 421 are displaced by $a_1/2$ from the holes in the belt-like area corresponding to the stripe layer 423.

Next, an electric-field control device 47 is set in the vicinity of the first mask 451 on the base body S in such a manner that the ion-introducing orifice 48 extends at an angle of 45° from the normal to the top surface of the base body S. In this step, the electric-field control device 47 is placed so that the ion-introducing orifice 48 is directed from top left to bottom right of the drawing. Subsequently, plasma is generated above the electric-field control device 47, and a potential difference is formed between the plasma and the base body S, whereby the base body S is etched (the first etching stage; FIG. 11B). In this etching, the ions that are directed from top left to bottom right pass through the ion-introducing orifice 48 and the holes 461 of the mask and impinge on the surface of the base body S. As a result, stripe layers 421 and 423 having air gaps 44 extending in the same direction as the incident direction of the ions are created.

Figure 12B:
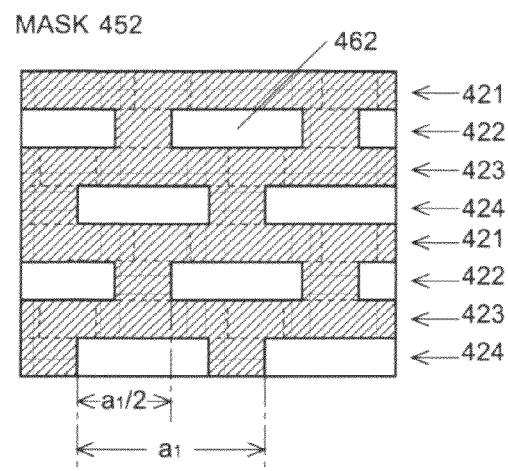

Next, the first mask 451 is removed, and a second mask 452 is formed on the surface of the base body S (FIG. 11C). The second mask 452 has holes 462 formed at the positions corresponding to the air gaps 44 of the stripe layers 422 and 424 (FIG. 12B). Subsequently, the electric-field control device 47 is set in the vicinity of the second mask 452 on the base body S. In this step, the electric-field control device 47 is placed so that the ion-introducing orifice 48 is directed from top right to bottom left of the drawing. Subsequently, plasma is generated above the electric-field control device 47, and a potential difference is formed between the plasma and the base body S, whereby the base body S is etched (the second etching stage; FIG. 11D). In this etching, the ions that are directed from top right to bottom left pass through the ion-introducing orifice 48 and the holes 461 of the mask and impinge on the surface of the base body S. As a result, stripe layers 422 and 424 having air gaps 44 extending in the same direction as the incident direction of the ions are created. Then, the second mask 452 is removed to complete the three-dimensional photonic crystal 40 (FIG. 11E).

Figure 13A:
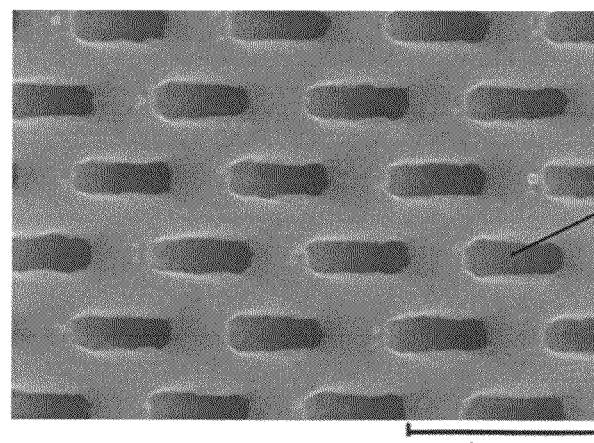
FIGS. 13A and 13B are electron microscope images showing a top face and a vertical section, respectively, of a base body after a first etching stage was completed in an experiment of fabricating a three-dimensional "woodpile" photonic crystal.
Figure 13B:
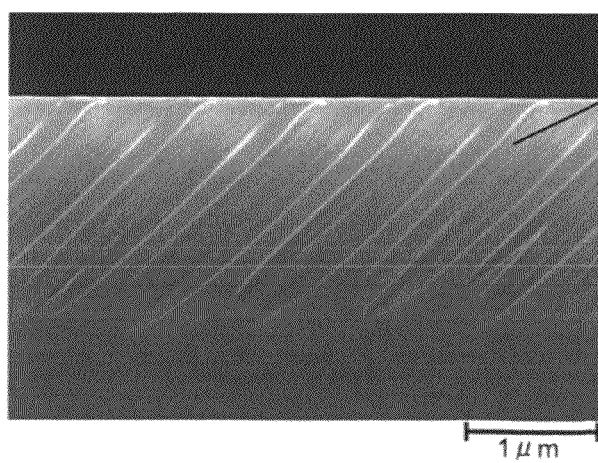

By means of FIGS. 13A, 13B, 14, 15A and 15B, an example of the three-dimensional woodpile photonic crystal fabricated by the method according to the present embodiment is illustrated. In this example, silicon was used for the base body. The spatial period a was set at 0.59 µm. FIGS. 13A and 13B are electron microscopic images showing the top surface and a vertical section, respectively, after the first etching stage. Linear air gaps 44 are formed at an angle of 45° from the normal to the top surface of the base body S. FIG. 14 is an electron microscope image showing the top surface (corresponding to the cross section 43 in FIGS. 10A and 10B) of the three-dimensional woodpile photonic crystal created by the method of the present embodiment. The $4n^{th}$ stripe layer 421, 4n+1$^{st}$ stripe layer 422, 4n+2$^{nd}$ stripe layer and 4n+3$^{rd}$ stripe layer are repeatedly formed in this order.

For the three-dimensional woodpile photonic crystal thus fabricated, FIGS. 15A and 15B show the measured values and theoretical values, respectively, of the reflectance and transmittance in the case where light was thrown onto the top surface of the crystal. The measured values agree well with the theoretical values. The PBG is formed within a range from 1.31 to 1.73 μm.

Figure 16A:
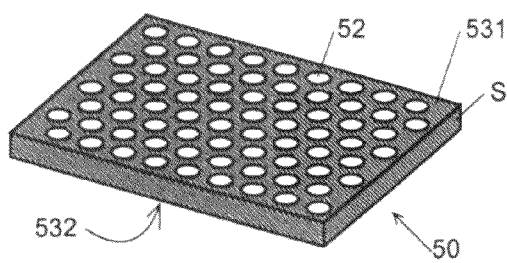
FIGS. 16A and 16B are a perspective view and a plan view, respectively, showing one example of the two-dimensional photonic crystal having three-directional oblique holes.
Figure 16B:
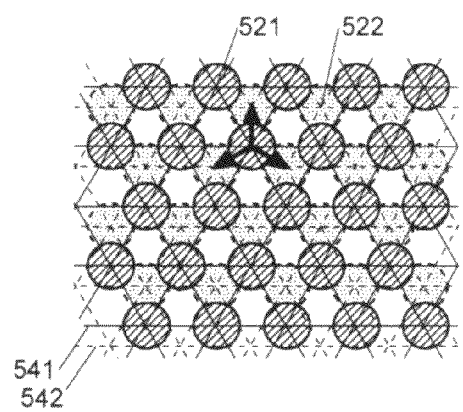
Figure 16C:
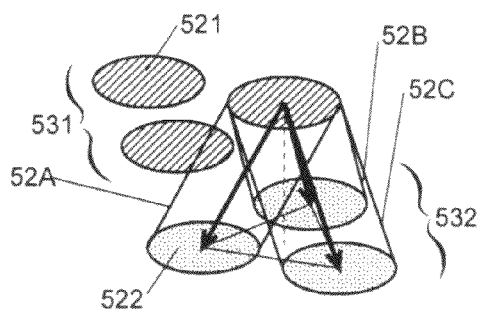
FIG. 16C is a perspective view of the three-directional oblique holes.

(2-2) Method for Producing Two-Dimensional Photonic Crystal Having Three-Direction Oblique Holes FIGS. 16A-16C show one example of the two-dimensional photonic crystal having three-direction oblique holes fabricated by the photonic crystal production method of the present embodiment. The two-dimensional photonic crystal having three-direction oblique holes 50 is a plate-shaped dielectric base body S in which holes 52 having a circular shape at any section parallel to the base body S are periodically formed (FIG. 16A). The holes 52 are located at the lattice points 521 of a triangular lattice 541 on the surface 531 of the base body S. On the reverse side 532 of the base body S, the holes 52 are located at the lattice points 522 of another triangular lattice 542 which are located directly below the centers of gravity of the triangles formed by the lattice points of the other triangular lattice 541 (FIG. 16B). From every lattice point 521, there are three air columns, i.e. the first air column 52A, the second air column 52B and the third air column 52C, which respectively extend to the three nearest lattice points 522. The extending directions of the first, second and third air columns 52A, 52B and 52C are indicated by the arrows in FIGS. 16B and 16C. The projected images of these arrows on the surface 531 are directed in the directions different from each other by 120° between the first, second and third air columns 52A, 52B and 52C.

The two-dimensional photonic crystal 50 having three-direction oblique holes can be produced by the following two methods.

(2-2-1) First Method

Figure 17A:
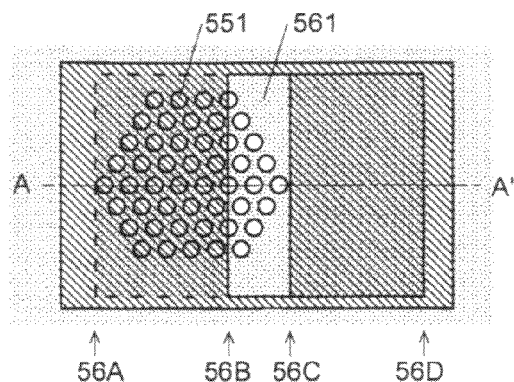
FIGS. 17A, 17C and 17D are top views
Figure 17B:
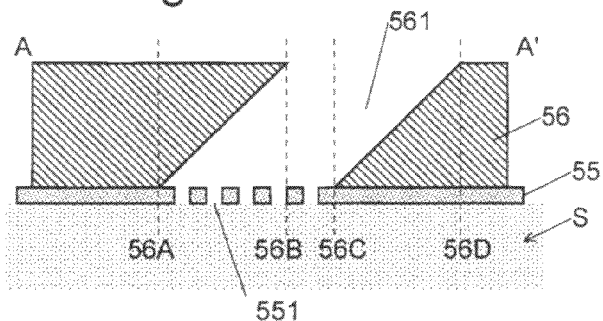
FIG. 17B is a vertical sectional view showing a first method for producing a two-dimensional photonic crystal having three-directional oblique holes.
Figure 17C:
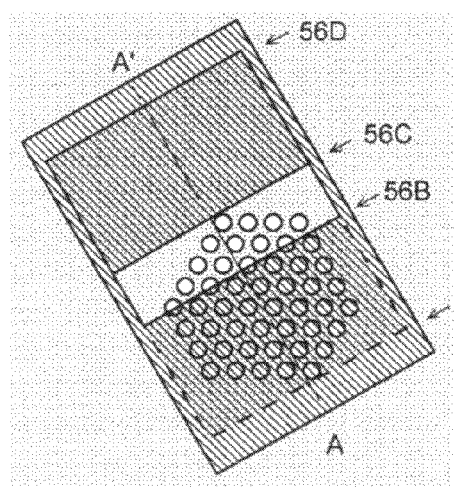
Figure 17D:
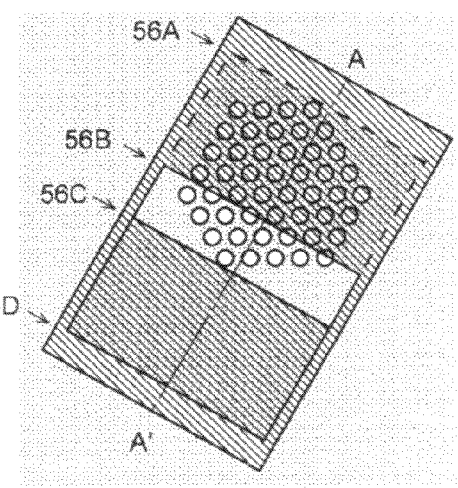

The first method uses an electric-field control device 56 with one ion-introducing orifice 561 inclined from the normal to the surface of the base body (FIG. 17B). The angle of the ion-introducing orifice 561 is determined by a preliminary experiment so that the base body S will be etched by plasma in the extending direction of the first air column 52A. To begin with, a mask 55 having holes formed in a triangular lattice pattern is formed on the base body S. Next, the electric-field control device 56 is placed on the mask 55 so that the extending direction of the ion-introducing orifice 561 coincides with that of the first air column 52A to be created (FIG. 17A). Subsequently, plasma is generated above the electric-field control device 56, and a potential difference is formed between the plasma and the base body S, whereby the base body S is etched. As a result, the first air column 52A extending from each hole 561 of the mask 55 in the same direction is formed. Next, the electric-field control device 56 is rotated by 120° around the normal to the surface of the base body S (FIG. 17C), and the base body S is etched, whereby the air column 52B is formed. Then, the electric-field control device 56 is further rotated by 120 (FIG. 17D), and the base body S is etched, whereby the air column 52C is formed. In this manner, the two-dimensional photonic crystal 50 having three-direction oblique holes can be produced.

(2-2-2) Second Method

The second method uses an electric-field control device 57 having an ion-introducing orifice 58 which is similar to the previously described electric-field control device 21 and has three holes (the first hole 58A, the second hole 58B and the third hole 58C) extending in different directions from the mouth facing the base body S (FIGS. 18A and 18B). The extending directions of these three holes of the ion-introducing orifice are designed to coincide with the extending directions of the first air column 52A, the second air column 52B and the third air column 52C. In the present method, after a mask 55 with holes arranged in a triangular lattice pattern within a partial area (the hole creation area) 552 is formed on the base body S, the electric-field control device 57 is placed on the mask 55 so that the mouth 581 of the ion-introducing orifice 58 facing the base body S is adjusted to the position of the hole creation area 552. Subsequently, plasma is generated above the electric-field control device 57, and a potential difference is formed between the plasma and the base body S, whereby the base body S is etched. In this process, the ions pass through the first, second and third holes 58A, 58B and 58C and impinge on the surface of the base body in the extending directions of the first, second and third air columns 52A, 52B and 52C, respectively. Thus, the first, second and third air columns 52A, 52B and 52C are simultaneously formed. In this manner, the two-dimensional photonic crystal 50 having three-direction oblique holes can be produced by a single operation.

(2-3) Three-Dimensional Yablonovite Photonic Crystal

Figure 19:
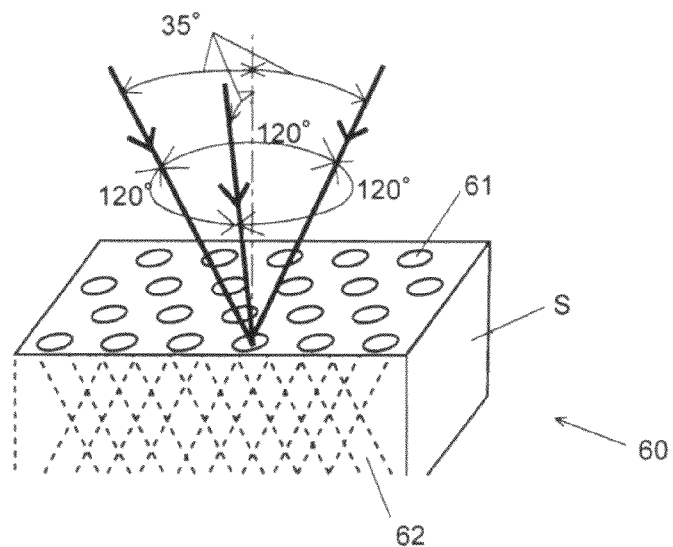
FIG. 19 is a perspective view showing one example of the three-dimensional Yablonovite photonic crystal.

FIG. 19 shows one example of the three-dimensional Yablonovite photonic crystal. The three-dimensional Yablonovite photonic crystal 60 is a structure having openings arranged in a triangular lattice pattern on the top surface of the base body S, with three holes 62 extending from each opening in three directions at an angle of 35° from the normal to the top surface of the base body S. The three holes 62 are at an angle of 120° from each other. In FIG. 19, the extending directions of the three holes 62 are indicated by the thick arrows. These holes 62 extend in the three directions toward the bottom side of the base body S, forming a three-dimensional periodic structure.

The three-dimensional Yablonovite photonic crystal 60 has a construction similar to that of the two-dimensional photonic crystal 50 having three-direction oblique holes except that deeper holes are bored to create the three-dimensional periodic structure. The particularly notable similarity between the three-dimensional Yablonovite photonic crystal 60 and the two-dimensional photonic crystal 50 having three-direction oblique holes is that there are three holes extending in three directions from each of a number of openings arranged in a triangular lattice pattern on the surface of the base body S. Accordingly, the three-dimensional Yablonovite photonic crystal 60 can be fabricated by the same methods as used for the two-dimensional photonic crystal 50 with three-direction oblique holes except that the etching is performed to deeper levels.

Figure 20A:
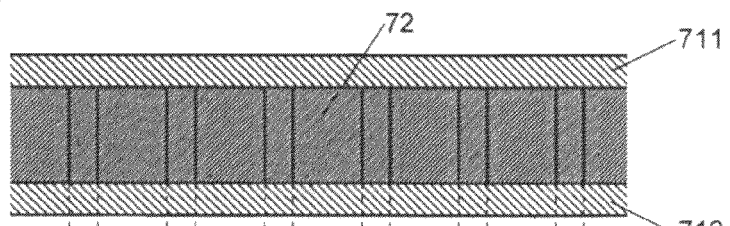
FIGS. 20A and 20B are a top view and a vertical sectional view, respectively, showing one example of the electric-field control device in which the direction of inclination of the ion-introducing orifice is variable.
Figure 20B:
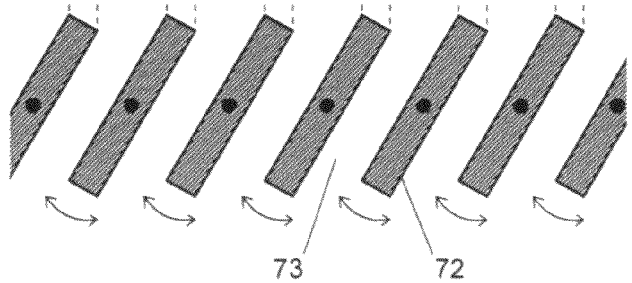

Thus far, the description was focused on the case of using an electric-field control device having a fixed direction of inclination of the ion-introducing orifice. However, as shown in FIGS. 20A and 20B, it is also possible to use an electric-field control device 70. The electric-field control device 70 has a pair of plate-shaped first frame 711 and second frame 712 between which a plurality of louver plates 72 are arranged parallel to the first and second frames 711 and 712. Each louver plate 72 has a rotation shaft perpendicular to the planes of the first and second frames 711 and 712. The space surrounded by two louver plates 72, the first frame 711 and the second frame 712 becomes an ion-introducing orifice 73. In this electric-field control device 70, the direction of the ion-introducing orifice 73 can be changed by rotating the louver plates 72.

Figure 21A:
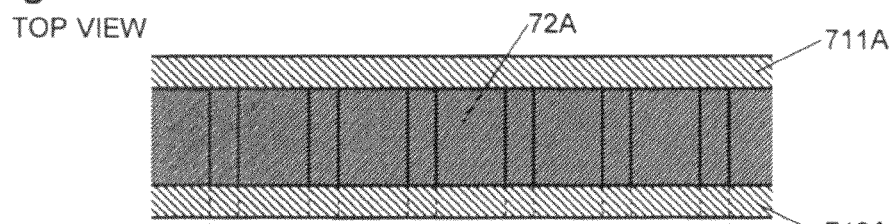
FIG. 21A is a top view.
Figure 21B:
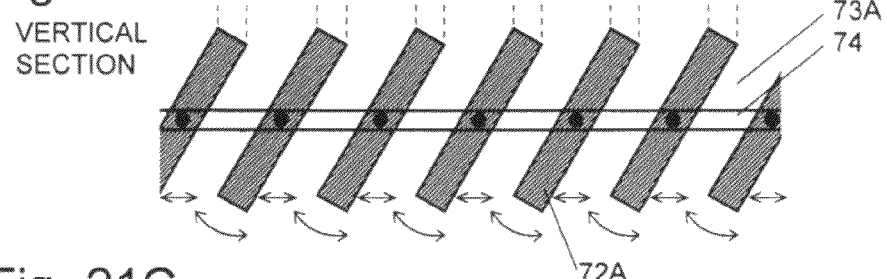
FIG. 21B is a vertical section view.
Figure 21C:
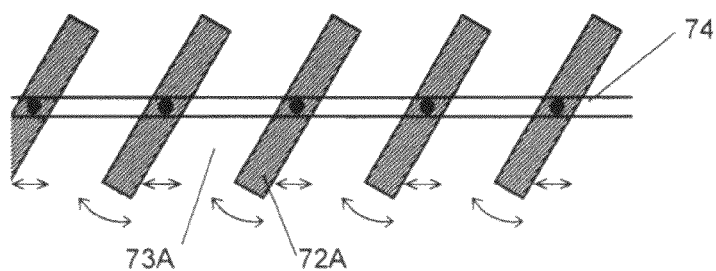
FIG. 21C is a vertical sectional view after the opening area is changed, showing one example of the electric-field control device in which the area of the mouth and the direction of inclination of the ion-introducing orifice are variable.

Furthermore, as shown in FIGS. 21A-21C, it is also possible to use an electric-field control device 70A having an ion-introducing orifice with a variable mouth area. Similar to the previously described electric-field control device 70, the electric-field control device 70A has a first frame 711A, a second frame 712A and louver plates 72A each having a rotation axis. Additionally, the electric-field control device 70A has a rail 74 on each of the mutually opposite faces of the first and second frames 711A and 712A. The space surrounded by two louver plates 72A, the first frame 711A and the second frame 712A becomes an ion-introducing orifice 73A. The rails 74 hold the rotation axes 73A in such a manner that the louver plates 72A can be moved along the rails 74. In this electric-field control device 70A, the mouth area of the ion-introducing orifices 73A can be changed by moving the louver plates 72A along the rails 74 and thereby changing the interval of the louver plates 72A. The electric-field control device 70A is capable of varying not only the mouth area of the ion-introducing orifices 73A but also the direction of the ion-introducing orifices 73A in a manner similar to the previously described electric-field control device 70.

In addition to the cases where the etching is performed in a direction inclined to the surface of the base body, it is also possible to orient the louver plates 72 (72A) perpendicularly to the surface of the base body to perform the etching in the direction perpendicular to the surface of the base body in order to achieve higher aspect ratios. Such a perpendicular etching can also be performed in the case where the direction of inclination and mouth area of the ion-introducing orifice are fixed. More specifically, an electric-field control device having an ion-introducing orifice penetrating through the same device in the normal direction to the surface of the base body is placed on this base body. Then, plasma is generated on the surface of the base body on which the electric-field control device is placed. A potential difference is formed between the plasma and the base body so that the ions in the plasma will be attracted toward the base body. Thus, the etching of the base body can be performed with a high aspect ratio in the direction perpendicular to the base body S. In the case of creating a specific pattern by the etching, the electric-field control device should be placed on the mask prepared for creating that pattern.

EXPLANATION OF NUMERALS 11, 11A, 11B, 21, 31, 47, 56, 57, 70, 70A . . . Electric-Field Control Device
12, 12A, 12B, 22, 32A, 32B, 32C, 48, 561, 58, 73, 73A . . . Ion-Introducing Orifice
121 . . . Top Side of Electric-Field Control Device
122 . . . Base-Body Side of Electric-Field Control Device
13 . . . Surface of Electric-Field Control Device
14 . . . Mask
141 . . . Pattern Creation Area
15, 15A, 15PA, 15PB . . . Equipotential Surface
151, 151A . . . Equipotential Surfaces Near Ion-Introducing Orifice
152A . . . tangent to Equipotential Surface
16, 16PA, 16PB . . . Trajectory of Ions
221 . . . Mouth of Ion-Introducing Orifice on Base-Body Side
22A, 58A . . . First Hole
22B, 58B . . . Second Hole
22C, 58C . . . Third Hole
40 . . . Three-Dimensional Woodpile Photonic Crystal
41 . . . Rod
42 . . . Stripe Layer
421 . . . First Stripe Layer
422 . . . Second Stripe Layer
423 . . . Third Stripe Layer
424 . . . Fourth Stripe Layer
43 . . . Cross Section
44 . . . Air Gap
451 . . . First Mask
452 . . . Second Mask
461 . . . Hole of First Mask
462 . . . Hole of Second Mask
50 . . . Two-Dimensional Photonic Crystal with Three-Direction Oblique Holes
52 . . . Air Hole
521, 522 . . . Lattice Point
52A . . . First Air Column
52B . . . Second Air Column
52C . . . Third Air Column
531 . . . Surface of Base Body S
532 . . . Reverse Side of Base Body S
541, 542 . . . Triangular Lattice
55 . . . Mask
551 . . . Hole of Mask
552 . . . Hole Creation Area
581 . . . Mouth
60 . . . Three-Dimensional Yablonovite Photonic Crystal
711, 711A . . . First Frame
712, 712A . . . Second Frame
72, 72A . . . Louver Plate
74 . . . Rail

The invention claimed is:

1. A plasma etching method, wherein a base body is etched by a process including:
   placing an electric-field shaping device on or above a surface of a base body, the electric-field shaping device having an ion-introducing orifice whose diameter is larger than a thickness of an ion sheath formed by plasma, the ion-introducing orifice penetrating fully from a first surface to a second surface in a direction inclined from a normal to the surface of the base body, and shaping an electric field in the ion-introducing orifice;
   generating plasma on the surface of the base body on or above which the electric-field shaping device is placed; and
   forming a potential difference between the plasma and the base body so as to attract ions in the plasma toward the base body, thereby directing the ions to the surface of the base body through the ion-introducing orifice.

2. The plasma etching method according to claim 1, wherein the ion-introducing orifice extends in a direction perpendicular to a surface of the electric-field shaping device.

3. The plasma etching method according to claim 1, wherein the ion-introducing orifice has a larger cross section at a surface of the electric-field shaping device and a smaller cross section inside the electric-field shaping device.

4. The plasma etching method according to claim 1, wherein the ion-introducing orifice has a plurality of holes extending in different directions from one mouth provided on a side facing the base body.

5. The plasma etching method according to claim 1, wherein the electric-field shaping device is moved along the surface of the base body while the aforementioned potential difference is formed.

6. The plasma etching method according to claim 5, wherein the electric-field shaping device has a plurality of the ion-introducing orifices.

7. The plasma etching method according to claim 1, wherein a gap is formed between the surface of the base body and the electric-field shaping device.

8. The plasma etching method according to claim 1, wherein a mask having a plurality of holes arranged in a predetermined pattern is placed at a mouth of the ion-introducing orifice facing the base body.

9. The plasma etching method according to claim 1, wherein the direction of inclination of the ion-introducing orifice in the electric-field shaping device is designed to be variable.

10. The plasma etching method according to claim 1, wherein an area of a mouth of the ion-introducing orifice in the electric-field shaping device is designed to be variable.

11. A method for producing a photonic crystal, wherein a dielectric base body is etched in a predetermined pattern by a process including the following steps:
- a mask having a plurality of holes in a predetermined pattern is set at a hole creation area which is a portion of a surface of the base body;
- an electric-field shaping device having an ion-introducing orifice whose diameter is larger than a thickness of an ion sheath formed by plasma, the ion-introducing orifice penetrating fully from a first surface to a second surface in a direction inclined from a normal to the surface of the base body is placed so that an electric field in the ion-introducing orifice is shaped and a mouth of the ion-introducing orifice facing the base body is adjusted at a position of the hole creation area;
- plasma is generated on the surface of the base body on or above which the electric-field shaping device is placed; and
- a potential difference is formed between the plasma and the base body so as to direct ions in the plasma toward the surface of the base body through the ion-introducing orifice.

12. The method for producing a photonic crystal according to claim 11, wherein performing the etching process multiple times while changing an orientation of the electric-field shaping device each time.

13. The method for producing a photonic crystal according to claim 12, wherein:
a) in a first etching stage:
- a-1) a mask with holes formed for a plurality of belt-like areas is used, where the holes formed for a $4n^{th}$ belt-like area (where n is an integer) are arranged with spatial period $a_1$ and the holes formed for a $4n+2^{nd}$ belt-like area are arranged with spatial period $a_1$ and displaced by $a_1/2$ in a longitudinal direction of the belt-like areas;
- a-2) the electric-field shaping device is arranged so that the ion-introducing orifice becomes inclined at a first angle from a normal to the surface of the base body in an extending direction of the belt-like areas;
b) in a second etching stage:
- b-1) a mask with holes is used, where the holes formed for a $4n+1^{st}$ belt-like area are arranged with spatial period $a_1$ and the holes formed for a $4n+3^{rd}$ belt-like area are arranged with spatial period $a_1$ and displaced by $a_1/2$ in a longitudinal direction of the belt-like areas; and
- b-2) the electric-field shaping device is arranged so that the ion-introducing orifice becomes inclined at a second angle, which is different from the first angle, from a normal to the surface of the base body in an extending direction of the belt-like areas.

14. The method for producing a photonic crystal according to claim 11, wherein the ion-introducing orifice has a plurality of holes extending in three directions from one mouth provided on a side facing the surface of the base body.

\* \* \* \* \*